United States Patent [19]

Swanson

[11] Patent Number: 4,639,728

[45] Date of Patent: Jan. 27, 1987

[54] METHOD OF AND SYSTEM FOR ACCUMULATING VERIFIABLE ENERGY DEMAND DATA FROM REMOTE ELECTRICITY METERS

[75] Inventor: Scott C. Swanson, Roswell, Ga.

[73] Assignee: Sangamo Weston, Inc., Norcross, Ga.

[21] Appl. No.: 776,719

[22] Filed: Sep. 16, 1985

[51] Int. Cl.$^4$ .............................................. G08C 5/12
[52] U.S. Cl. ............................... 340/870.03; 379/107
[58] Field of Search ...................... 340/870.02, 870.03, 340/310 A, 870.11, 870.19; 324/137, 141, 142; 179/2 AM, 4

[56] References Cited

U.S. PATENT DOCUMENTS 4,298,839 11/1981 Johnston .................... 340/870.02 X
4,504,831 3/1985 Jahr et al. ........................ 340/870.03

Primary Examiner—Jerry W. Myracle
Attorney, Agent, or Firm—Dale Gaudier

[57] ABSTRACT

Pulses generated by the pulse initiator of an electricity meter (30) are counted during successive measurement intervals. The pulse count for each interval is stored in the solid state memory (42) of a recorder (10), to be thereafter transmitted to a central computer and printed and/or displayed to obtain energy demand survey and billing data. The operation of the recorder is controlled by a programmable microprocessor (38). To verify the accuracy of the pulses counted during each interval, the counts are accumulated over a predetermined number of successive intervals constituting a record. The accumulated count is compared with an encoded register reading obtained from the meter (30) at the end of the record. If there is acceptable correlation between the accumulated count and encoded meter reading, the interval pulse counts associated with that record are deemed verified. Power for the recorder (10) is obtained from the powerline, except during power outages in which case a rechargeable battery (28) provides back-up power. Battery charging is under the control of the microprocessor.

12 Claims, 9 Drawing Figures

METHOD OF AND SYSTEM FOR ACCUMULATING VERIFIABLE ENERGY DEMAND DATA FROM REMOTE ELECTRICITY METERS

TECHNICAL FIELD

The invention relates generally to electricity meter data collection, and, more particularly, toward methods and apparatus for collecting verifiable remote electricity meter data for surveying energy consumption and for customer billing.

BACKGROUND ART

Electricity and other forms of energy are billed in accordance with energy consumption that may vary with the size of the customer and the time of day. Since the peak amount of energy consumed by a customer over a given time period (so-called "demand") determines the size of the service required, e.g. size of conductors, transformers, peak generating capacity, etc., many utilities measure this peak consumption or demand to determine the rate to be charged the customer for all electricity consumed over a given period.

To determine the amount of energy being consumed by each customer during successive demand intervals, utility companies have located, at customer sites, electricity meters, such as watthour meters containing a demand register, which must periodically be read either by the customer or by a representative of the utility, to accumulate billing data (e.g. peak demand and total energy consumed). In addition, to evaluate customer energy demand so as to assess the capability of the utility's equipment to satisfy demand, or to justify rate modification, energy demand occassionally must be surveyed over an extended period of time, e.g. 18 months.

Electrical demand is typically measured by the use of a pulse initiator which utilizes a photo-optical detector to detect the rotation of the eddy-disk of a watt-hour meter and produces a series of pulses whose frequency is directly related to the instantaneous power (demand) being delivered to the customer.

Typically, a demand register accumulates these pulses over a preselected interval, e.g. 15 minutes, to give an indication of the peak demand over the interval. This peak demand data is then stored in a memory device for subsequent readout or display.

Since there will often be large numbers of meters registering demand throughout a utility system there exists a need to monitor electrical demand simultaneously at a large number individual customer sites, and to process the data at a central location. This is commonly done by means of a mainframe computer operated by the utility company. This information is used by the utility to assess demand parameters such as peak demand and seasonal as well as daily demand variations. Accordingly, systems have been developed for polling customer meters to extract and transmit energy demand data over commercial telephone lines to the central computer for accumulation and processing.

Because the investment required to provide automatic polling of remote meter registers at the the customer site is substantial, as an alternative, automatic meter data recorders have been developed that are set up at customer sites to be monitored. The data recorders commonly employ magnetic tape storage techniques to record pulses generated by the pulse initiator of the meter that represent electrical demand during successive intervals. The magnetic tape is then carried to the utility for processing.

Magnetic tape recorders of the type employed for this purpose are relatively complex, require substantial battery power to operate in the event of a power failure and may fail to work properly in environments exposed to temperature extremes. Recently, due in part to availability of inexpensive solid state memory devices, portable meter reading devices having solid state memories have been developed for accumulating demand data stored in a meter. The reading device is then either brought to the central computer and the data transmitted directly to the computer, or the data is transmitted over telephone lines to the central computer. There is a tendency, however, for errors to occur in the acquisition and transmission of data. These errors are caused by among other things failures of the solid state memory, misdetection of pulses generated by the electricity meter and, most commonly, electrical noise contamination. Data acquisition errors are particularly troublesome because they affect, among other things, the accuracy of customer billing. For this reason there currently exists a significant need to verify energy demand data accumulated from customer meters to ensure that the data is accurate. Also, since peak demand data must be correlated with the time of day, day-of-week, season, etc. for proper billing purposes, it is necessary that such a data acquisition device be capable of operation despite power outages occuring on the powerline.

One object of the invention, therefore, is to provide a method of and system for verifying data accumulated from remote electricity meters during successive demand intervals and to confirm that the data measured represents data upon which a utility company or other controlling institution can rely. Another object is to provide a relatively inexpensive and reliable device for making energy demand measurements and verifying their reliability at customer meter sites for the purpose of obtaining demand survey and customer billing data. A further object is to provide an electricity demand data acquisition device which operates reliably even during a power outage.

DISCLOSURE OF THE INVENTION

A system for accumulating verifiable energy demand data from a remote electricity meter, in accordance with the invention, comprises means for detecting and counting pulses generated by the remote electricity meter which are indicative of energy consumption at the customer site during successive time intervals. The pulse count during intervals is stored in a solid state memory means. A predetermined number of successive time intervals constitutes a record. Also stored in the memory means at the end of each record is an encoded representation of the then current meter register reading, i.e., the energy demand accumulated up through the current record interval. With the interval pulse counts and encoded register readings stored in different addressable locations of the memory means, the interval pulse counts contained in each record can be readily verified by accumulating the total number of counts over a measuring period for comparison with the encoded register reading.

In accordance with another aspect of the invention, means are provided at either the customer site or central computer for accumulating the pulse counts obtained during the successive intervals of a record, and converting the accumulated pulse counts into accumulated energy consumption data. At the end of each record, the energy demand corresponding to the accumulated pulse count is compared with an encoded meter reading to verify that the interval pulse counts are reliable.

The output of the solid state memory as well as of the register encoder can be transmitted optically (e.g. over an optical link) or electrically to a portable data storage device or transmitted directly to a central computer (e.g. over a telephone line).

The system preferably comprises microprocessor based circuitry contained either in the electricity meter or in a separate housing. The microprocessor is controlled by a stored program and data accumulated from the meter are stored in a solid state memory.

To ensure reliable operation in the event of a power outage, a battery backup power supply is also provided. In accordance with a further aspect of the invention, the battery is recharged as needed under control of the same microprocessor that controls meter data acquisition. An additional object of the invention, therefore, is to provide a microprocessor controller system, compatible with data acquisition, for battery recharging.

BRIEF DESCRIPTION OF THE DRAWING FIGURES

The foregoing objects and advantages of the present invention will be more clearly understood when considered in conjunction with the following description of the preferred embodiments of the invention, when taken in conjunction with the drawing figures, wherein:

FIG. 7 is a graph of battery charging current as a function of time developed by the software of FIG. 6c.

BEST MODE FOR PRACTICING THE INVENTION

Figure 1A:
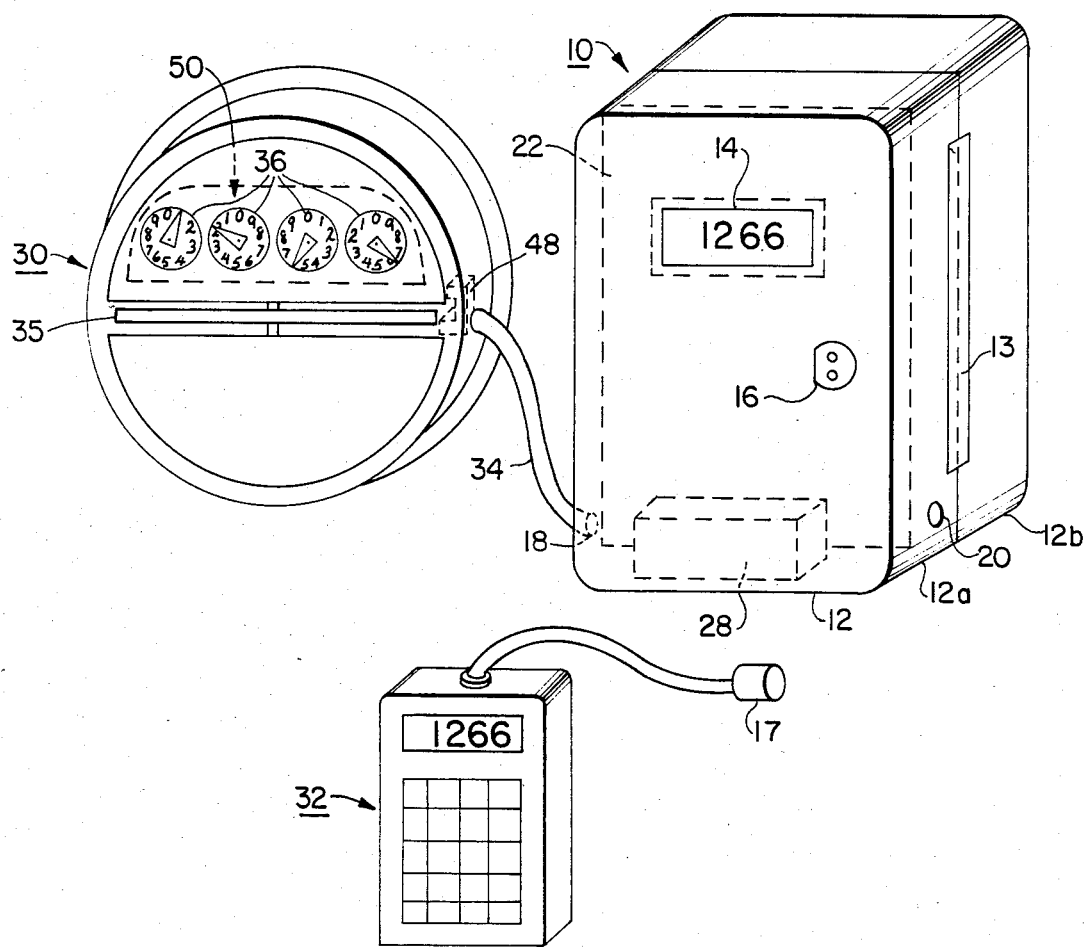
FIG. 1a is a perspective view of one embodiment of a solid state data recorder, in accordance with the invention, wired to a remote electricity meter.

Referring to FIG. 1a, a solid state data acquisition unit 10, in accordance with the principles of the invention to be hereinafter described, comprises a housing 12 having a display 14, and an optical port 16 as well as hard-wired ports 18 and 20. Within housing 12 is a circuit board 22 containing microprocessor circuitry to be hereinafter described, display driver circuitry and optical data transmission interface circuitry. The circuitry contained on board 22 normally is powered through a conventional power supply which derives its power from the electrical powerline or mains (not shown). As described more fully below, board 22 also contains circuitry for charging a rechargeable battery 28. Battery 28 is used to supply power to the circuitry on board 22 when a power outage occurs or the electrical mains supply is otherwise interrupted.

Recorder 10 is adapted to receive and record energy demand measured by an electricity meter 30 at a customer site, to format the data and, ultimately, transmit the data from port 20 to a central computer over commercial telephone lines or transmit the data from optical port 16 via an optical coupler 17 attached to a portable data retreiver/recorder 32, such as the TELXON model 790, made by Telxon Corp. The data accumulated by the recorder 10 is formatted into demand levels during successive predetermined fixed time intervals, e.g. fifteen minute intervals. A predetermined number of successive intervals, e.g. sixty intervals, constitutes a record.

Recorder 10 is coupled via port 18 to meter 30 over wires 34 which carry energy demand pulses generated by a standard pulse initiator, such as shown in U.S. Pat. No. 4,321,531, synchronized to the rotating eddy-disk 35 of the meter. Also transmitted to recorder 10 over wires 34 are digitally encoded data representative of the analog reading of meter register 36. For brevity, and because the structure and operation of the pulse initiator and register encoder within meter 30 are well known to those skilled in the art, details of the initiator and encoder are not described herein.

Figure 1B:
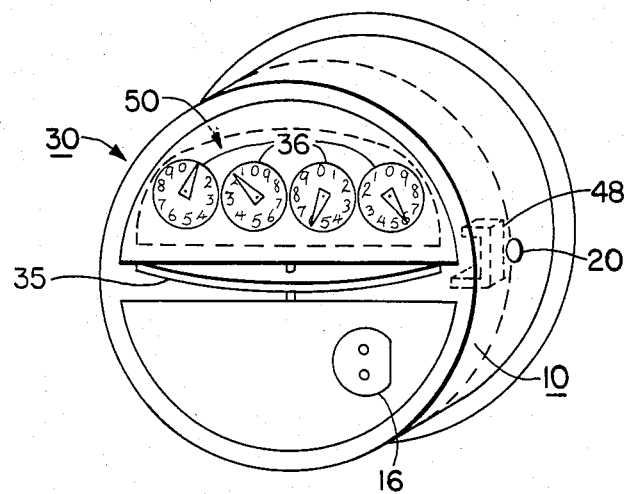
FIG. 1b is a view of another embodiment wherein the data recorder is provided inside the meter.

In FIG. 1b, recorder 10 is incorporated within meter 30, with data transfer between the meter and recorder being established internally. The external hard-wire port 20 is adapted to carry data bidirectionally between recorder 10 and an external modem (not shown), although the modem could alternatively be provided within the meter. The external optical port 16 is available to transfer data to a portable recorder in the same manner as described with respect to FIG. 1a.

Circuitry within recorder 10 is preferably of a high impedance, low power consumption type, to minimize current drain of battery 28 during power outages. Battery 28 is rechargeable under control of microprocessor circuitry to be hereinafter described, using a programmed control strategy which measures the duration of time that the battery has been discharged under load during a power outage and, based upon the predicted amount of current discharge, calculates the period of time required to fully recharge the battery.

Figure 2:
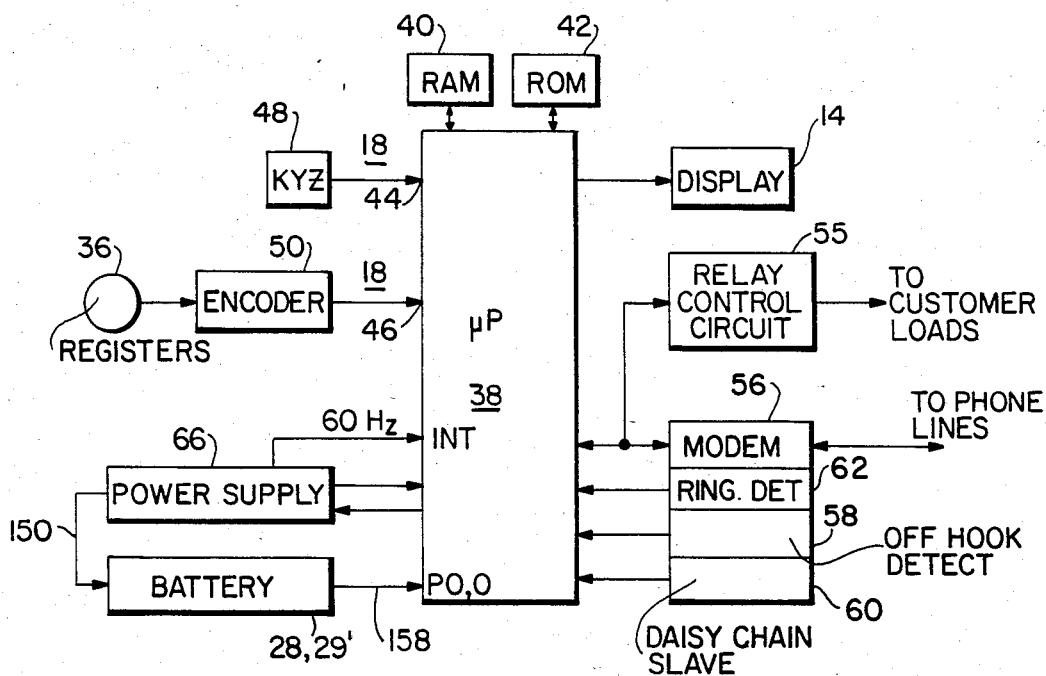
FIG. 2 is a block diagram of the circuitry incorporated in the data recorder of FIGS. 1a and 1b.

Control circuitry incorporated within the recorder 10 preferably is CMOS circuitry based, and may for example, be based upon an 80C31 microprocessor manufactured by INTEL Corporation. A microprocessor of this type, designated as 38 in FIG. 2, includes, on the same substrate, a random access memory (RAM) 40 and a read only memory (ROM) 42 which contains appropriate programming for microprocessor 38, to be hereinafter described. Alternatively, RAM 40 and ROM 42 can comprise separate memory chips which are connected to microprocessor 38. Microprocessor 38 is located on circuit board 22 within housing 12, shown in FIG. 1a. Housing 12 comprises upper and lower portions 12a and 12b which are pivotable on hinge 13, to expose the interior of the housing for maintenance.

Microprocessor 38 receives real time energy demand pulses at its input port 44 from recorder port 18. The pulses, sometimes termed "KYZ" pulses, are generated by a pulse initiator 48 within meter 30. Also received by microprocessor 38 at input 46 (also from recorder port 18) are digitally encoded meter register readings. Whereas the pulses generated by pulse initiator 48 are received by microprocessor 38 continuously and without interrogation, the register encoder 50 is interrogated periodically by microprocessor 38. This is because, as described in detail hereinafter, the register readings are used to verify pulse counts obtained during the demand intervals making up each record. Although only a single meter 30 is in circuit with recorder 10 over lines 34 in FIG. 1 (termed "single channel operation"), it is to be understood that multiple channel operation of recorder 10 is easily provided by proper data partitioning in RAM 40.

Display 14 preferably is a liquid crystal display (LCD) controlled by microprocessor 38 to display summary data, such as time, meter identification number and peak demand as well as total energy usage.

Port 20 is a communication channel that couples data bidirectionally between the microprocessor 38 and a central computer (not shown) over commercial telephone lines. Port 20 is in circuit with a conventional modem 56 controlled by the microprocessor 38 to periodically automatically dial the central computer and transmit to it data stored in RAM 40. Because no transmitting of data over the telephone lines can take place when any telephone extensions at the customer site are off hook, an off hook detector 58 provides that information to the microprocessor 38. Recorder 10 may be daisy chained with a number of other recorders by unit 60 to enable several recorders to transmit data successively over the telephone lines to the central computer. Alternatively, the central computer may poll any of a number of different recorders 10 within a network of such recorders by calling the recorders by telephone successively, preferably at night when telephone use by the customer is unlikely. In this regard, ring detector 62 in response to an incoming call captures the telephone lines to transmit data to the central computer.

A power supply 66 develops trickle charging current to maintain rechargeable battery 28 fully charged when recorder 10 is connected to a source of AC powr. Power supply 66 may also supply bias and other operating voltages to microprocessor 38. Alternatively, bias may be applied to microprocessor 38 only by battery 28 which is maintained charged by supply 66. Software for controlling power supply 66 is provided in ROM 42 and is described in detail below.

Figures 3, 4:
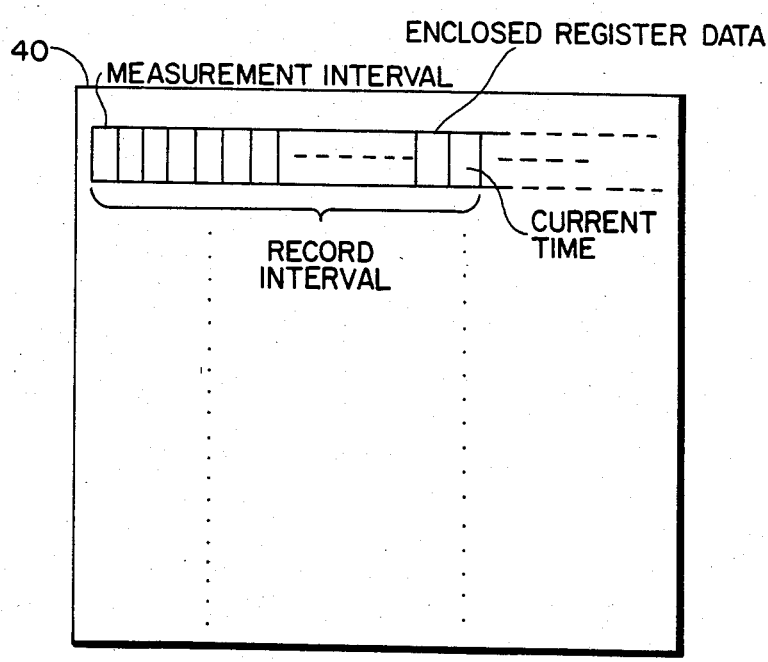
FIG. 3 is a diagram of the data protocol used to transmit data between the microprocessor of FIG. 2 and a central computer.
FIG. 4 is a schematic representation of data mapped into the random access memory of FIG. 2.

The data transferred between microprocessor 38 and the central computer via port 20 are formatted with six primary data fields as shown in FIG. 3. The PREAMBLE field identifies the nature of the data being transmitted between recorder 10 and the central computer. Information included in the preamble is the number of channels supported by the recorder, the length of time of the measurement interval associated with the recorder, current memory addresses into which incoming interval counts are to be stored, the interval number within a record and data describing characteristics of the particular recorder in use.

The TIME/IDENTIFICATION field includes an identification number of the recorder, security data to prevent unauthorized data access, and current time as well as the time of the last interrogation of the recorder to identify any unauthorized attempts to access data.

The DIAL UP field, which enables the recorder 10 to dial a central computer at specified times, contains the telephone number of the central computer with predetermined transmit times or time windows. If communication between the recorder and host computer over the telephone lines during the time window cannot be established because an extension telephone is off-hook as determined by detector 58 (FIG. 2), or for other reasons, transmitting is postponed until a subsequent time window.

The TEST field provides a number of functional tests for the remote recorder 10, including echo back of characters received from the central computer, software debugging and testing of the input port 44 to verify proper operation of pulse initiator 48.

The INTERVAL DATA field, which is of particular significance in this invention, is a data field that identifies the number of pulses received from pulse initiator 48 during each measurement interval (e.g., a fifteen minute interval). A predetermined, fixed number of measurement intervals, e.g., sixty, constitute a record. Microprocessor 38 includes a "real-time" clock which is used to define the duration of each demand interval and a record. Preferably, the real-time clock is periodically synchronized with a clock generated by the central computer whose time is transmitted to the recorder when it is polled by the central computer.

FIG. 4 is a symbolic map of random access memory 40, wherein each storage location contains a byte of data representing the number of pulses generated by initiator 48 during a corresponding interval. The maximum pulse count must be scaled to avoid a pulse overflow in the event that energy demand during any interval is greater than the maximum amount of energy demand expected. Successive measurement interval data are stored in successive addressable storage locations of RAM 40, with a predetermined number of measurement intervals constituting a record, as shown.

At the end of each record interval summary data are used to establish and verify the pulse counts that represent energy demand during successive intervals. Of particular importance among these summary data is data representative of the then current encoded register entry at the end of the record interval. This encoded register data is stored at the end of the data interval record. The encoded register data should correspond to the sum of the pulses contained in all the recorded intervals up through the end of the current record. The encoded register entry thus is a verification that energy demand during the intervals of a record, measured by the pulse initiator 48 and stored in memory 40, appears to be accurate and can be accepted as reliable.

Also contained in each record interval is the current time of the record and, optionally, additional data peculiar to that record and associated with the measurement intervals contained therein.

Set forth below is an exemplary report that is generated by the central computer in response to data transmitted to it by recorder 10. The data are categorized by pulses per measurement interval, total accumulated pulses within the current record, corresponding demand in kilowatt-hours, current encoded register readings, as well as an indication, based upon a comparison of encoded register and accumulated pulse readings, whether the two are within a predetermined tolerance band and the interval pulse counts are therefore deemed reliable.

| INTERVAL | 1 | 2 | 3 | 4 ... 60 |
| --- | --- | --- | --- | --- |
| Pulse count | 200 | 160 | 140 | 130 ... 170 |
| Accum-pulses | 200 | 360 | 500 | 630 ... 12550 |
| Demand (kwh) | 60 | 480 | 420 | 390 ... 510 |
| Register | 196 | 354 | 490 | 620 ... 12400 |

| -continued | | | | |
|---|---|---|---|---|
| INTERVAL | 1 | 2 | 3 | 4 ... 60 |
| Verify: | YES | | | |

Figure 5A:
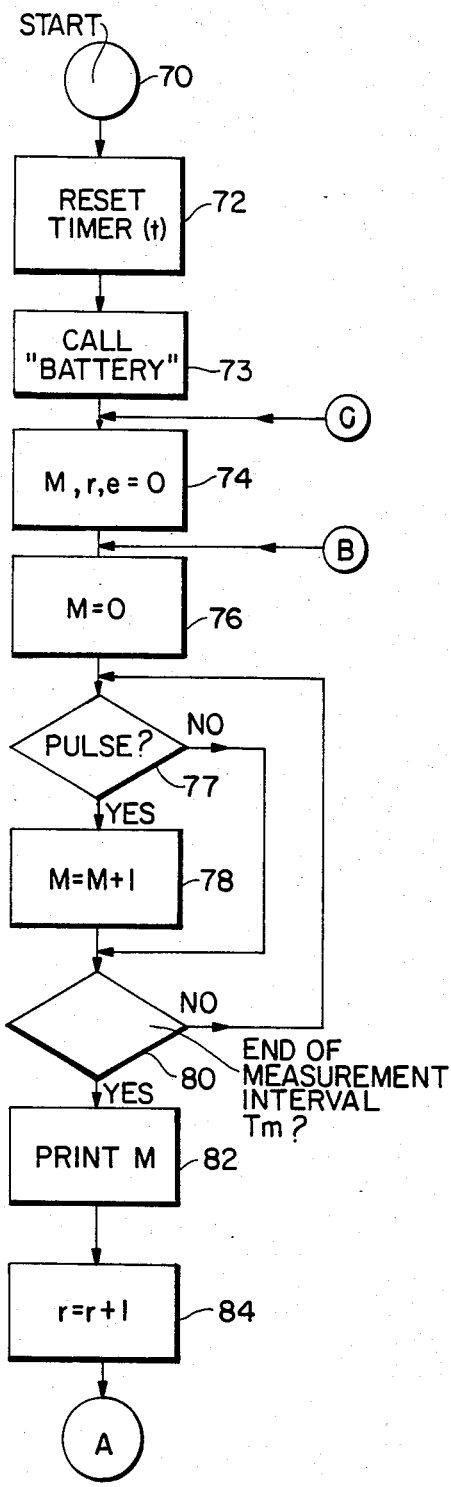
FIGS. 5a-5c are a simplified flow chart of the the steps used for operating the microprocessor of FIG. 2 to control data acquisition.
Figure 5B:
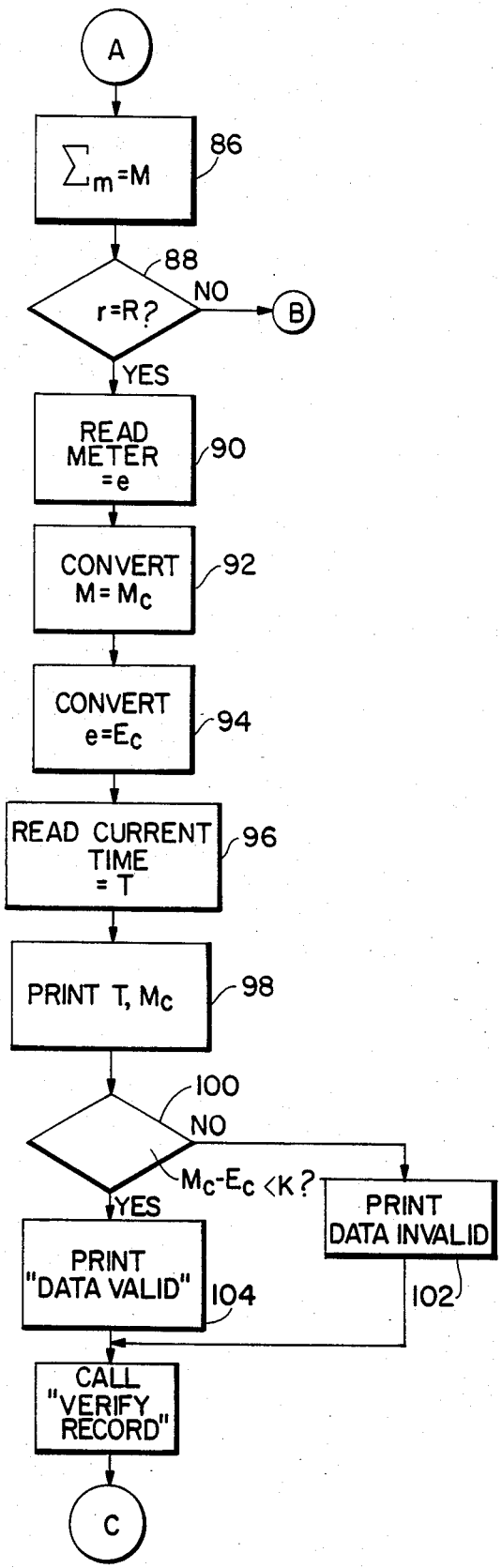
Figure 5C:
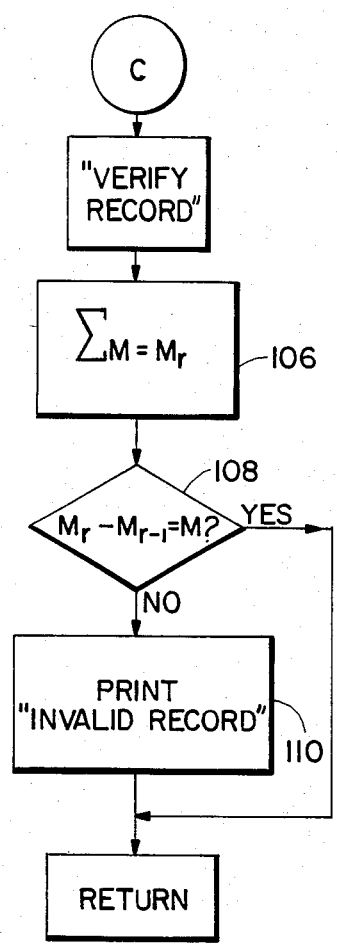

Programming in ROM 42 for controling microprocesor 38 to store data in RAM 40 as formatted in FIG. 4 and to control the central computer so as to generate some of the data contained in the above report is shown in the flow chart of FIG. 5a-5c. It is to be understood, however, that all data processing could, if desired, be carried out at the customer site.

As an overview, the program of FIGS. 5a-5c controls microprocessor 38 to count the number of switch closures of pulse initiator 48 that occur during a first interval time $T_m$, records and/or displays the count and repeats these steps for each interval for the duration $T_r$ of a record. The program additionally accumulates pulse counts for all intervals of the record and compares these accumulated pulse counts with an encoded register reading made at the end of the record interval. If the accumulated pulse count corresponds, within a predetermined tolerance window, to the reading of the encoded meter register, the pulses counted during each measurement interval of the record are deemed reliable.

Referring to FIG. 5a, at the beginning of execution of the program at step 70, a timer established by software within ROM 42 is reset (step 72). A subroutine "BATTERY" (step 73) is called if necessary to recharge battery 28. The subroutine shall be described later with reference to FIG. 6. The following software variables are now reset (step 74):
M: accumulated pulse count
r: interval number
e: register reading
The variable m representing interval pulse count is next reset (step 76).

Pulses are counted in steps 77 and 78, and at the end of a measurement interval $T_M$, determined in step 80, the interval pulse count m is printed and/or displayed (step 82). This pulse count corresponds to energy demand during the current measurement interval.

The variable r, representing the interval number, is incremented (step 84) and, referring to FIG. 5b, the interval pulse count m is added to any previously accumulated pulse count accumulated during the current record (step 86). In the present example, of course, because the current interval is the first interval of a record, there is no pulse count accumulation.

If the current interval r is not the last interval R of a record (step 88), program execution returns to step 76 to measure and process the next interval pulse count. If, on the other hand, the current interval r is the last intrval R of the record, program execution continues to step 90 wherein the digitally encoded output of the meter register 36 is read. The accumulated pulse count M and the encoded register reading e are now converted to compatible units $M_c$, $E_c$ (steps 92 and 94). Current time (e.g. kept by a real-time clock formed as part of microprocessor 38) is read in step 96, and, together with the pulse count for each measurement interval of the current record, printed and/or displayed (step 98). A comparison is now made between the accumulated pulse count M and encoded register reading $E_c$ to determine whether the two are within a predetermined tolerance band k (step 100). If the two data are out of tolerance, the label "data invalid" or similar message is printed and/or displayed (step 102); otherwise, the label "data valid" (step 104) is printed and/or displayed, and in either case, execution of the program, following execution of an optional subroutine "VERIFY RECORD" to be described below, returns to step 76 to accumulate data for the next record interval.

The program can be modified in various ways depending upon the particular report/display format desired. As one example, printing/displaying of the pulse count data during each interval can be inhibited for each interval that the pulse count is deemed during step 100 to be out of tolerance. Additional techniques for confirming that the record obtained by the recorder 10 is reliable can be employed. As one example, with reference to FIG. 5c, during the subroutine "VERIFY RECORD", the number of pulses accumulated from the end of the previous record to the current time is summed (step 106) to obtain a composite sum $M_r$. This composite sum represents the amount of energy demand at the monitored site that has been measured since the time the test was previously initiated. In step 108, the composite sum $M_r$ is compared to the composite sum $M_{r-1}$ (corresponding to energy demand up to but not including the current record) is obtained and compared to the sum M obtained during only the current record. If there is a match, the current record is deemed reliable; otherwise, the label "invalid record" is printed and/or displayed (Step 110) and execution of the program returns to the main program shown in FIGS. 5a, 5b.

Figure 6:
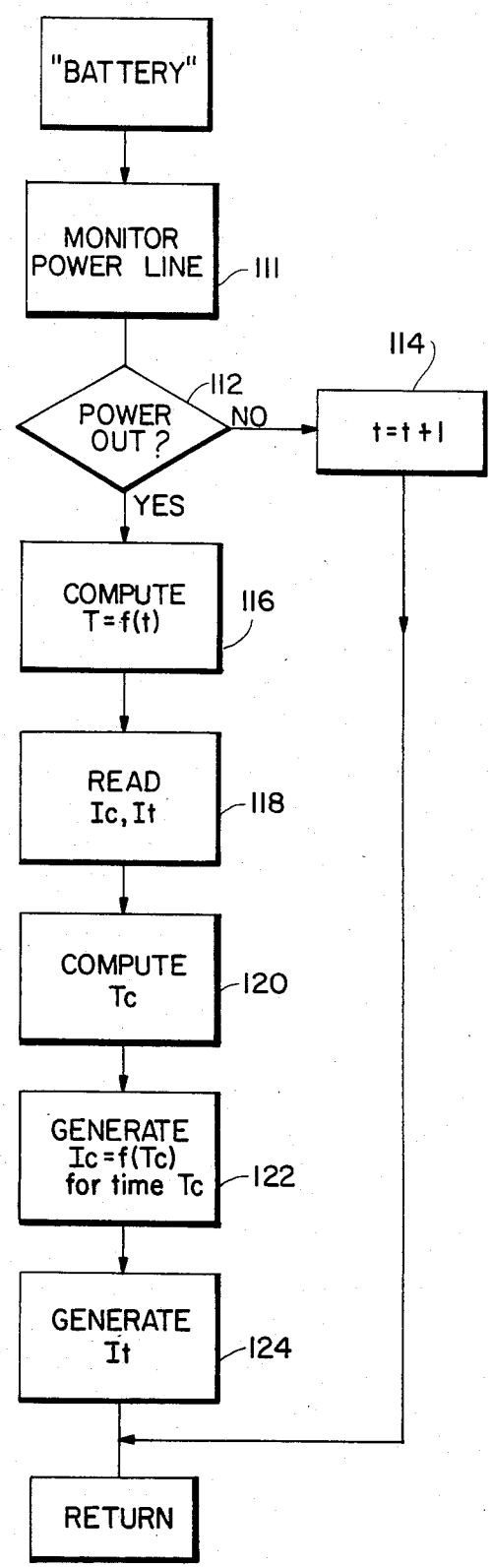
FIG. 6 is a simplified flow chart of software for controlling the microprocessor during charging of the backup battery of FIG. 2.

Turning now to FIGS. 6 and 7, the operation of the battery recharging circuit within power supply 66 (FIG. 2) will be described. In accordance with the control strategy of the invention, and with reference initially to FIG. 7, battery 28 normally is maintained fully charged while recorder 10 is powered by the electrical mains or AC powerline by receiving from supply 66 a trickle charge $I_t$, which typically is on the order of 0.1% of the ampere-hour rating of the battery. Battery 28 will become discharged, however, during periods of power outage or when the recorder 10 is intentionally disconnected from the main AC power source, as the battery continues to supply the power required to operate microprocessor 38 and its associated circuitry. In either case, microprocessor 38 measures the time period of the power outage, and when external power is reapplied, the microprocessor calculates the duration of time that a predetermined magnitude of charging current $I_c$ must be applied to battery 28 to fully charge it. Thereafter, at time $T_c$, shown in FIG. 7, the trickle charge mode resumes.

Referring to FIG. 6, the subroutine "BATTERY" called in step 73 of the main program first measures line power (step 111) to determine whether there is a power outage (step 112). If there is a power outage, the duration of the outage is determined by step 116. The values of charging and trickle currents $I_c$, $I_t$, prestored in ROM 40, are read (step 118) and battery 28 is charged (step 120) for the duration of time $T_c$ (step 122) that is calculated during step 120. Thereafter, the microprocesor controls supply 66 to supply to battery 28 trickle charge current $I_t$ until a power outage is again determined to have occurred.

The calculation that is provided in step 120 is a function of the duration of power outage, the discharge current determined by the magnitude of the battery voltage and impedance of its load, and magnitude of the charging current $I_c$. Based on these parameters persons of ordinary skill will be able to develop a factor by which to simply multiply the power outage duration to obtain the appropriate recharge duration $T_c$ for a chosen battery type.

There has been described a solid state data recording device to be installed at a customer site to monitor energy consumption measured by an electricity meter, such as a watthour meter or similar instrument. Interval pulses developed by a standard pulse initiator in the meter are accumulated for each measurement interval of a record, to be transmitted to a central computer for further analysis and/or for billing purposes. The data are verified at two levels. First, counts measured during each interval are accumulated and compared, at the end of each record, to an encoded register reading. If the comparison falls within a predetermined tolerance window, the interval counts are deemed verified. Second, the differences between the counts accumulated for all records and the counts accumulated up to and including only the previous record is compared with the count accumulated for only the current record. If there is a match, the current record is deemed verified.

The recorder is powered by a battery recharged by a microprocessor controlled circuit that measures the time duration of any power outage, and in response, calculates the amount of time that the battery must be recharged to be fully charged, and thereafter, trickle charges the battery.

It will be apparent that the embodiments shown herein are only exemplary, and that various modifications can be made that are within the scope of the invention as defined in the following claims.

What is claimed is:

1. A system for accumulating verifiable energy demand data from a remote electricity meter of a type having at least one register indicating accumulated demand and generating pulses corresponding to demand rate, comprising:
   means for detecting pulses generated by said meter;
   means for counting the pulses detected by said detecting means during a predetermined measurement interval to develop an interval pulse count;
   means for digitally encoding an output of said register;
   means for reading an output of said encoding means at the last of a predetermined number of measurement intervals;
   solid state memory means for storing data; and
   means for storing interval pulse counts and encoded register readings in different addressable locations of said memory means.

2. The system of claim 1, including: means for reading said addressable memory locations representing interval pulse counts for a predetermined number of intervals, said intervals constituting a record, together with an associated encoded register reading; means for accumulating pulse counts during said record; and means for correlating said encoded register reading with said accumulated pulse counts to verify said accumulated pulse counts.

3. The system of claim 2, wherein said correlating means is at a central computer, and said reading means includes means for transmitting data read from said memory means to said central computer over telephone lines.

4. The system of claim 2, wherein said correlating means is at a central computer, and said reading means includes means for converting data read from said memory means into optically transmittable data; and further including means for transmitting said optical data to a portable data receiver, said portable data receiver including: means for converting said optical data into corresponding electrical signals; means for storing said electrical signals; and means for transferring data stored in said portable data receiver to said central computer.

5. The system of claim 2, including: means for converting pulse counts read from said memory means into energy demand data; means responsive to said accumulated pulse count and said encoded register reading for verifying said energy consumption data and developing corresponding reliability data; and means for displaying said energy consumption data and corresponding reliability data.

6. The system of claim 1, including further means for storing periodically in said memory means data identifying a current time.

7. The system of claim 1, including:
   means for accumulating interval counts for a predetermined number of intervals constituting a record;
   means for determining the difference between (1) a pulse count accumulated to the end of a current record, and (2) a pulse count accumulated to the end of the previous record; and
   means for comparing said difference to the accumulated pulse count of only the current record to verify the current record.

8. The system of claim 1, wherein said memory is powered by a battery during a power outage, and including means for recharging said battery following the power outage, said recharging means including means for measuring a time period of said power outage, calculating a period of time required to recharge the battery at a predetermined rate of recharge, and, in response, controlling said recharging means.

9. A method of accumulating verifiable energy demand data from a remote electricity meter of a type generating electrical pulses as a function of energy demand at the site of the meter and having at least one register providing an indication of accumulated energy demand, comprising the steps of;
   detecting electrical pulses generated by said meter;
   counting said pulses during a predetermined measurement interval to develop an interval pulse count;
   accumulating pulse counts over a predetermined number of intervals constituting a record to obtain an accumulated pulse count;
   digitally encoding the output of the register;
   reading the digitally encoded output at the end of each record; and
   comparing the encoded register reading with said accumulated pulse count to verify the pulse counts developed during the current record.

10. The method of claim 9, including the steps of: converting said pulse count into energy demand data and displaying said energy demand data corresponding to each measurement interval within a record; and displaying an indication of verification of the energy demand data over the corresponding record interval.

11. The method of claim 9, including the step of displaying the current time associated with each record.

12. The method of claim 9, including the steps of: determining the difference between (1) a pulse count accumulated to the end of a current record and (2) a pulse count accumulated to the end of a previous record; and
   comparing said difference to the accumulated pulse count of the current record to verify the accuracy of the current record.

* * * * *